(12) United States Patent
Ferris

(10) Patent No.: US 7,161,406 B1
(45) Date of Patent: Jan. 9, 2007

(54) METHOD AND APPARATUS FOR PROVIDING NON 2:1 GILBERT CELL MIXER

(75) Inventor: Daniel J. Ferris, Lakeville, MN (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/824,960

(22) Filed: Apr. 15, 2004

(51) Int. Cl.
*G06F 7/44* (2006.01)
(52) U.S. Cl. .................................... 327/359
(58) Field of Classification Search ........ 327/355–357, 327/359–362; 455/326, 333; 330/252, 261
See application file for complete search history.

(56) References Cited

U.S. PATENT DOCUMENTS

| | | | | |
|---|---|---|---|---|
| 5,532,637 | A * | 7/1996 | Khoury et al. | 327/359 |
| 5,867,778 | A * | 2/1999 | Khoury et al. | 455/321 |
| 6,073,002 | A * | 6/2000 | Peterson | 455/326 |
| 6,163,215 | A * | 12/2000 | Shibata et al. | 330/254 |
| 6,438,365 | B1 * | 8/2002 | Balteanu | 455/326 |
| 6,510,314 | B1 * | 1/2003 | Kuo | 455/326 |
| 6,639,447 | B1 * | 10/2003 | Manku et al. | 327/359 |

OTHER PUBLICATIONS

Paul Gray et al.; "Analysis and Design of Analog Integrated Circuits"; Section 10.3; John Wiley & Sons, N.Y.,; 1993; pp. 667-681.
Barrie Gilbert; "The Micromixer: A Highly Linear Variant of the Gilbert Mixer Using a Bismmetric Class-AB Input Stage"; IEEE Journal of Solid-State Circuits, vol. 32, No. 9; Sep. 1997; pp. 1412-1423.

* cited by examiner

*Primary Examiner*—My-Trang Nu Ton
(74) *Attorney, Agent, or Firm*—LeRoy D. Maunu

(57) ABSTRACT

A method and apparatus for providing non 2:1 current in a Gilbert cell mixer is disclosed. The Gilbert cell mixer provides lower voltage operation, lower LO drive and better linearity. Additional current sources are provided to drive the lower, source-coupled transistor pair thereby allowing operation of the switch transistors with lower current.

20 Claims, 6 Drawing Sheets

METHOD AND APPARATUS FOR PROVIDING NON 2:1 GILBERT CELL MIXER

FIELD OF THE INVENTION

This invention relates in general to mixer circuits, and more particularly to Gilbert cell mixers and related methods.

BACKGROUND

In recent years there has been notable progress and changes in the world of telecommunications. In particular, the development of new integrated electronic devices on semiconductors has contributed to a large number of these changes. Amongst these improvements is the reduction of power consumption in portable electronic equipment. This reduction of energy consumption has permitted a reduction in weight and dimensions of this portable equipment, lengthening at the same time their useful life. All this has resulted in a large decrease in costs, something that has made this type of portable electronic equipment accessible to a large part of the population as for example mobile cellular telephones or portable computers. The effort to reduce the size of electronic circuitry is continuing.

This growing demand for low voltage, low power, low cost and high performance mobile communications equipment has changed the way wireless receivers are designed. A fundamental building block for radio frequency transceivers in such electronic circuitry is a modulator/demodulator. Modulators are used to modulate a data input such as a voice input, onto a carrier frequency. Modulators are also referred to as "mixers" or "multipliers". Demodulators are used to demodulate data from a high frequency carrier. For example, in a mobile telephone, a modulator/demodulator is used for the telephone transceiver.

Mixers may be broadly classified as either passive or active. Passive mixers, for example, may be based upon a FET or diode ring and provide no conversion gain. However, the active mixer approach yields lower conversion loss and/or gain, and a good degree of balance. A particular type of active modulator that is widely used is the "Gilbert Multiplier Cell", also referred to as the "Gilbert Modulator", the "Gilbert Cell" or the "Gilbert Mixer".

The. Gilbert. Multiplier Cell includes a source-coupled transistor pair, also referred to as the lower transistors or driver transistors, which is coupled to a pair of cross-coupled source-coupled transistor pairs, also referred to as the upper transistors, switch transistors or active mixer transistors. For example, RF inputs may be coupled to the source-coupled transistor pair and a local oscillator is coupled to the pair of cross-coupled source-coupled transistor pairs to produce a demodulated output. The Gilbert Multiplier Cell is extensively described and analyzed in Section 10.3 of the textbook "Analysis and Design of Analog Integrated Circuits" by Paul Gray and Robert Meyer, John Wiley and Sons, N.Y., 1993, pp. 670–675.

Prior mixer topologies exhibit disadvantages as the supply voltage is decreased. In a Gilbert cell mixer, the minimum supply voltage is defined by three transistors connected across the supply voltage as well as series connected the load resistances. The required voltage drop over transistors is technology dependent. Attempts to reduce the supply voltage may result in transistors of the differential or long tailed pairs going into the linear region, which has a number of disadvantageous effects. Also, large current through the switching transistors necessitates a large LO drive to provide the desired IR drop through the switching transistors. Further, higher third-order intercept points are needed to amplify large signals without distortion. However, as technologies shrink so do the supply voltages thereby demanding mixer designs that can operate at lower supply voltages while providing the needed performance.

It can be seen then that there is a need for a mixer that provides lower voltage operation, lower LO drive and better linearity.

SUMMARY

To overcome the limitations in the prior art described above, and to overcome other limitations that will become apparent upon reading and understanding the present specification, the present invention discloses a Gilbert cell mixer and related methods.

The present invention solves the above-described problems by providing a mixer that provides lower voltage operation, lower LO drive and better linearity. Additional current sources are provided to drive the lower, source-coupled transistor pair thereby allowing operation of the switch transistors with lower current.

A mixer in accordance with the principles of the present invention includes a differential amplifier for receiving and amplifying input signals, the amplifier stage providing a predetermined gain to the input signals, a load for providing a load impedance, a dual differential switching stage, coupled to the differential amplifier and the load, the dual differential switching stage mixing the amplified input signals from the differential amplifier with a local oscillator signal to produce an output signal at the load and a current modifier, coupled to the differential amplifier, the current modifier altering current in the differential amplifier to adjust current through the load.

In another embodiment of the present invention, another mixer is provided. This mixer includes a Gilbert cell comprising an RF amplifier stage and a mixer stage and a current modifier, coupled to the differential amplifier, the current modifier altering current in the differential amplifier to adjust current through the load.

In another embodiment of the present invention, a method for mixing two signals is provided. The method includes providing a Gilbert cell comprising an RF amplifier stage and a mixer stage and injecting current into the amplifier stage to reduce current through the mixer stage by supplementing current in the amplifier stage.

In another embodiment of the present invention, a method for mixing two signals is provided. This method includes providing a Gilbert cell comprising an RF amplifier stage and a mixer stage and sinking current from the amplifier stage to alter current through the mixer stage.

In another embodiment of the present invention, another mixer is provided. This mixer includes means for amplifying an input signal, means for receiving the amplified input signal and for providing a balanced differential output signal having a first frequency translated using the frequency of the amplified input signal and means, coupled to the means for amplifying, for injecting current into the means for amplifying to reduce current through the means for receiving the amplified input signal and for providing a balanced differential output signal by supplementing current in the means for amplifying.

In another embodiment of the present invention, another mixer is provided. This mixer includes means for amplifying an input signal, means for receiving the amplified input signal and for providing a balanced differential output signal having a first frequency translated using the frequency of the amplified input signal and means, coupled to the means for amplifying, for sinking current from the means for amplifying to alter current through the means for receiving the amplified input signal and for providing a balanced differential output signal.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a Gilbert cell mixer and related methods. A Gilbert cell mixer according to the present invention may be implemented as a demodulator and provides lower voltage operation, lower LO drive and better linearity. The Gilbert cell mixer includes additional current sources to drive the lower, source-coupled transistor pair thereby allowing operation of the switch transistors with lower current.

Figure 1:
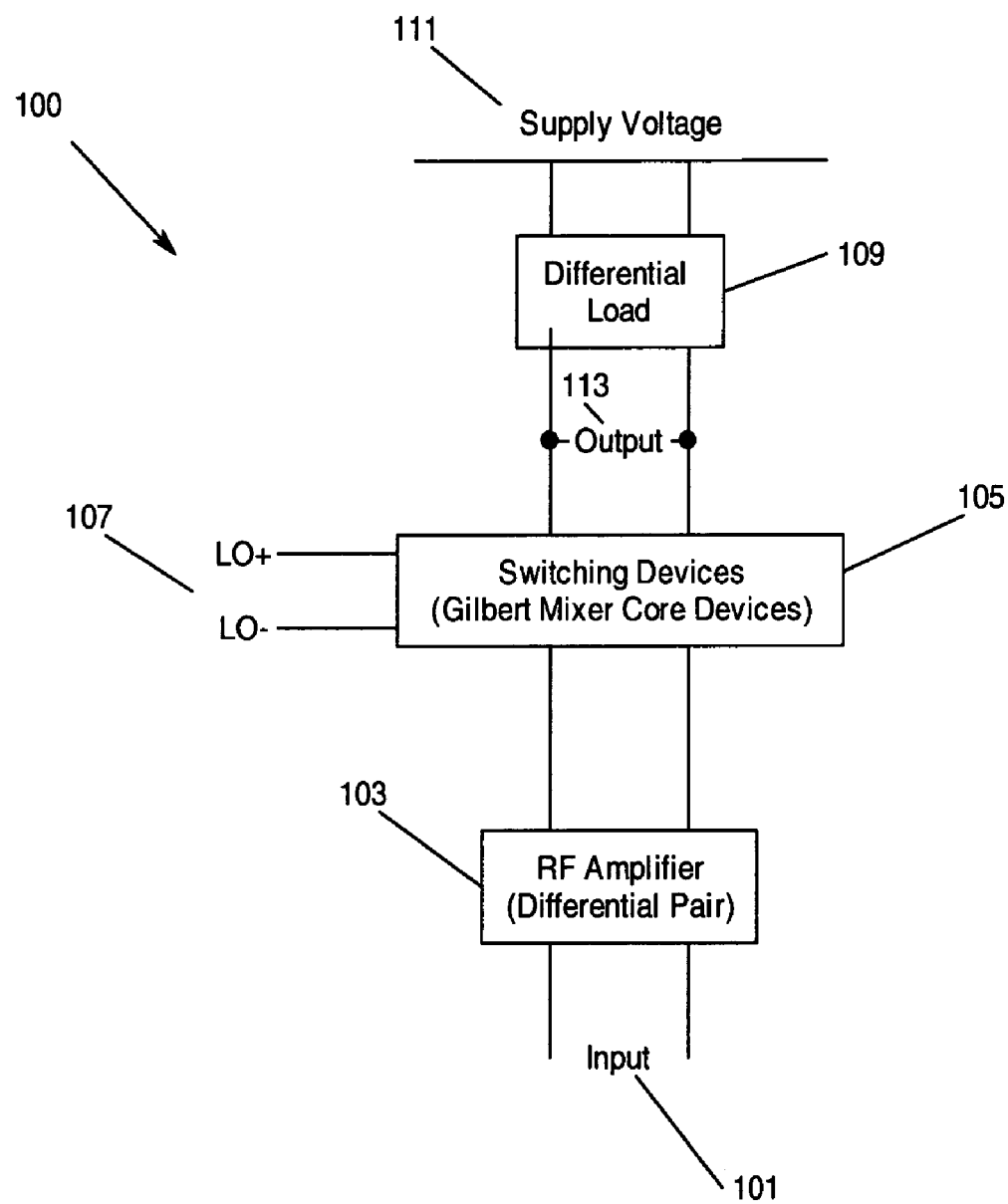
FIG. 1 illustrates a block diagram of a Gilbert cell mixer.

FIG. 1 illustrates a block diagram of a Gilbert cell mixer 100. The Gilbert cell mixer includes an RF input signal 101 is fed to a RF input transconductor amplifier 103 such as a differential pair. The RF signal is amplified and then input to a mixer 105 formed by a plurality of switching devices. The mixer 105 works to provide sum and difference RF signals based on the frequency of the input signals from RF input transconductor amplifier 103 and the local oscillator (LO) input signals 107. With proper application of a differential load 109 and the voltage supply 111, the resultant output signals are provided at the output 113.

Figure 2:
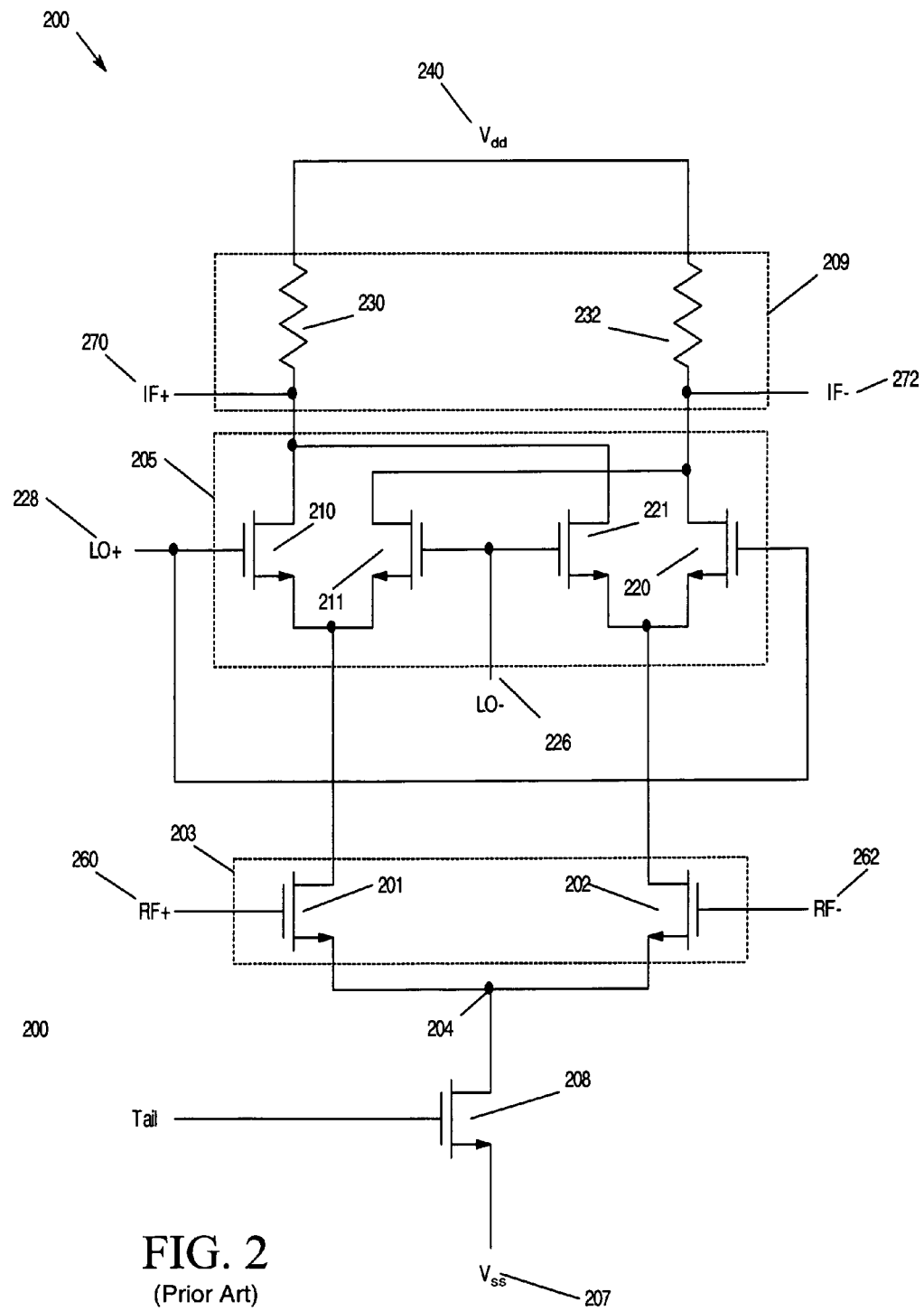
FIG. 2 illustrates a first Gilbert cell mixer topology
Figure 3:
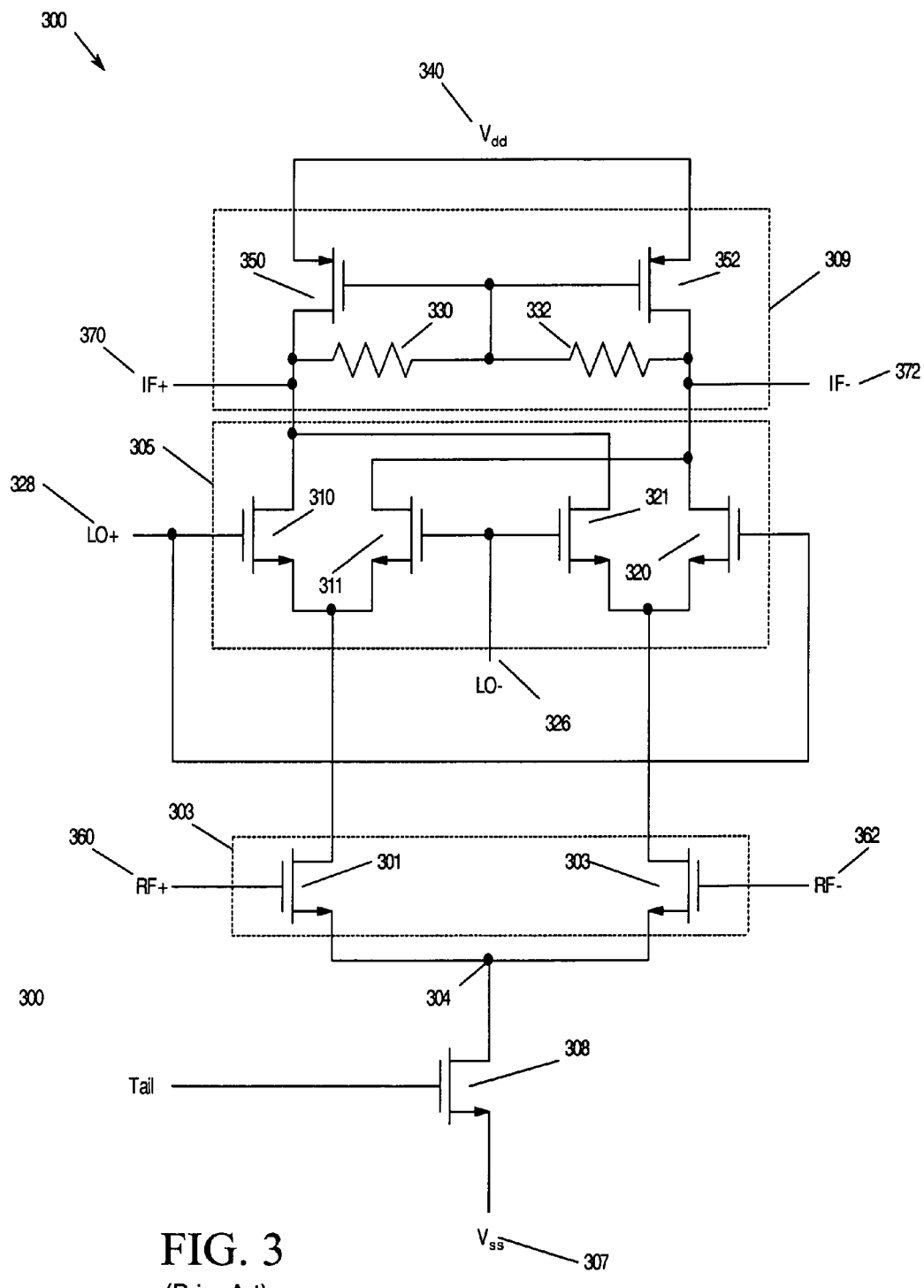
FIG. 3 illustrates a second Gilbert cell mixer topology.
Figure 4:
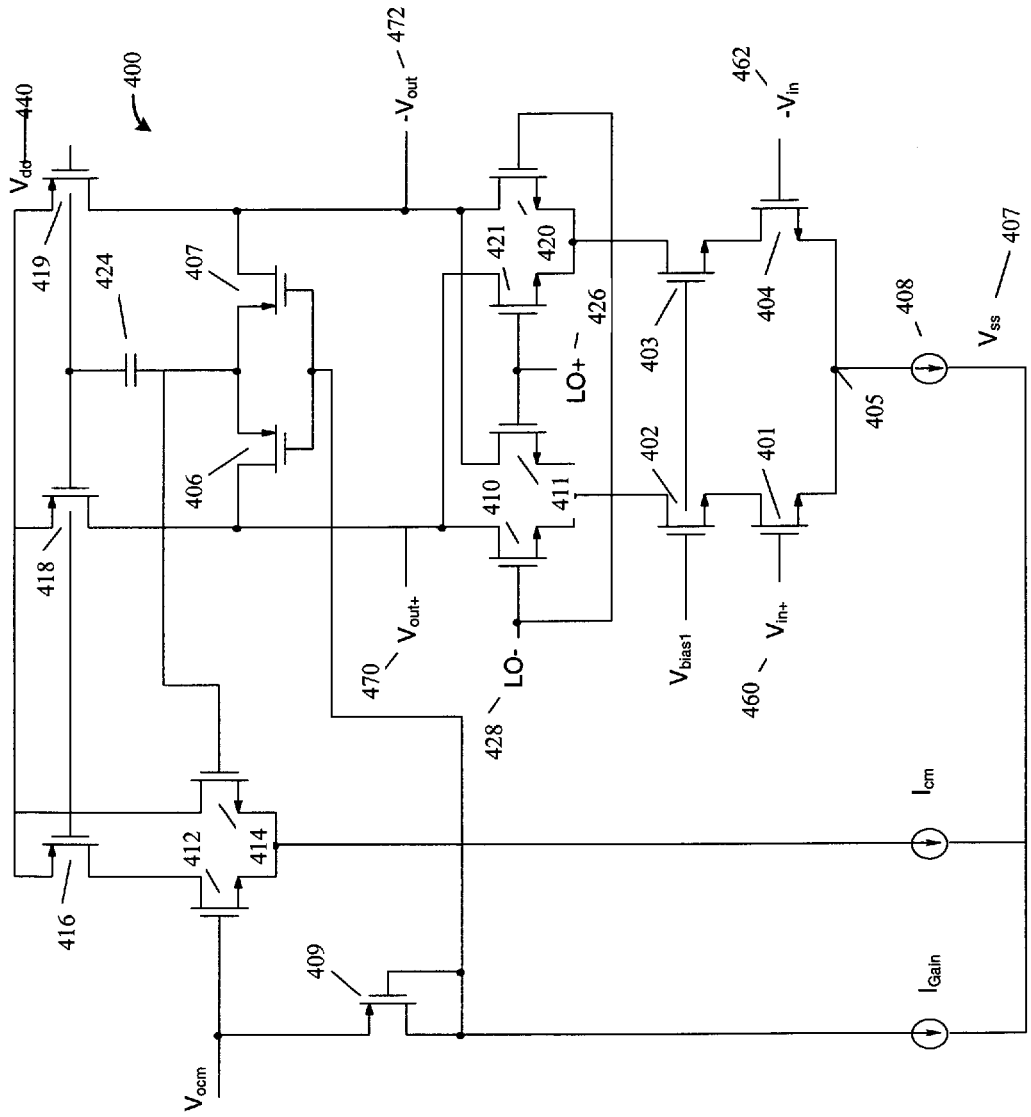
FIG. 4 illustrates a third Gilbert cell mixer topology.

FIGS. 2–4 illustrate three prior mixer circuit topologies. However, as technologies shrink so do the supply voltages. All three of the mixer topologies shown in FIGS. 2–4 have disadvantages as the supply voltage is decreased.

FIG. 2 illustrates a first Gilbert cell mixer topology 200. The Gilbert cell mixer includes an RF input transconductor amplifier 203, core switching devices 205 and differential load 209. The Gilbert cell mixer topology 200 has highly negative aspects because the AC gain and IR drop are a function of the load resister. A Gilbert cell mixer topology 200 implemented with bipolar junction transistors (BJT) is described in detail in "DESIGN CONSIDERATIONS FOR BJT ACTIVE MIXERS", by Barrie Gilbert, Workshop Notes, Analog Devices, Inc., Rev. 2.2, Sep. 4, 1994. However, those skilled in the art will recognize that the Gilbert cell mixers may be implemented using other embodiments than BJT Gilbert cell mixers, including MOS embodiments.

Gilbert cell mixers include four transistors 210, 211, 220, 221, known as an upper quad core of transistors 205. The upper quad core of transistors 205 are differentially connected in a common source configuration and in turn connected to a differentially connected at the lower, source coupled driver transistors 201, 202. As shown in FIG. 2, the Gilbert cell mixer 200 has two input ports RF+ 260, RF− 262, and output ports 270, 272.

A first pair of NMOS transistors 201, 202 has a common source terminal 204 that is connected to the drain of transistor 208. The source of transistor 208 is connected to the negative supply rail 207. The gate of transistor 208 controls the tail current through transistor 208. The drain of the first NMOS transistor 201 is connected to the common sources of a second NMOS pair 210, 211 and the drain of the second NMOS transistor 202 is connected to the common sources of a third NMOS pair 220, 221. The gates of the transistors 211 and 221 are connected together 226. The drain of transistor 210 is connected to the drain of transistor 221 at a node 222. The drains of the transistors 211 and 220 are connected together at a second node 223. The first node 222 is connected to a first output resistor 230, which is connected to the supply rail 240. The second node 223 is connected to a second output resistor 232, which is connected to the positive supply rail via 240.

FIG. 3 illustrates a second Gilbert cell mixer topology 300. The Gilbert cell mixer topology 300 improves upon the design 200 shown in FIG. 2 by decoupling the IR drop and the AC gain. The resistors control the AC gain, while the IR drop is controlled by the PMOS transistor's $V_t$, W/L, $I_d$. To maintain a small IR drop, W and L are usually large thereby resulting in a large capacitance. This large capacitance limits the frequency response and effectively the maximum resistance allowed because the capacitance tends to dominate after a few kilo-ohms (k°) of resistance.

FIG. 4 illustrates a third Gilbert cell mixer topology 400. The Gilbert cell mixer topology 300 improves upon the topologies 200, 300 of FIGS. 2–3 by placing the PMOS load transistors in a servo loop. The input transconductance stage consists of a simple differential pair 401, 404. The cascode devices 402, 403 provide LO-to-RF isolation. Devices 410, 411, 420, 421 act as switches in the mixer. Devices 406, 407 are used to set both the load and the gain that may be modulated on-chip by varying the current through diode-connected device 409. Common-mode feedback is achieved with devices 412, 414, 416, and the current source consisting of devices 418, 419. Devices 416, 418, 419 are connected to the supply rail 440. Compensation for the common-mode feedback loop is provided with capacitor 424. The Gilbert cell mixer 400 has two input ports $V_{in}+$ 460, $V_{in}-$ 462, and two output ports 470, 472. Devices 401, 404 have a common source terminal 405 that is connected to current source 408, which in turn is connected to the negative supply rail, $V_{ss}$, 407. By placing the PMOS load transistors in a servo loop, the IR drop across the PMOS load can be as low as a Δv, i.e., $\sqrt{2I_d B}$. However, this is achieved by using a more complex circuit, more current and more biases.

Figure 5:
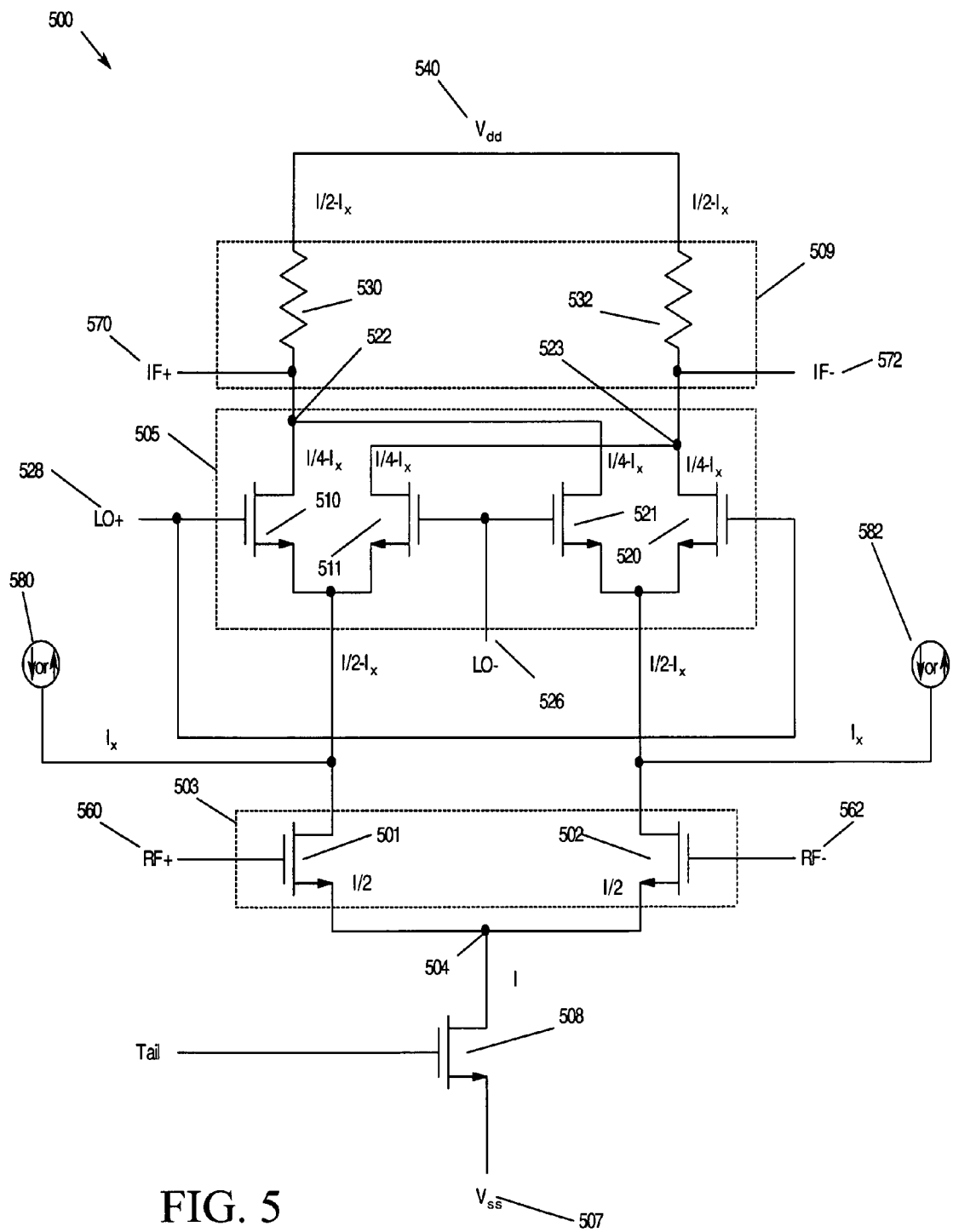
FIG. 5 illustrates a non 2:1 Gilbert cell mixer according to an embodiment of the present invention.

FIG. 5 illustrates a non 2:1 Gilbert cell mixer 500 according to an embodiment of the present invention. As illustrated above, in a typical Gilbert cell mixer, the current through each of the input amplifier transistors is twice the current through the transistors of the switching devices, and the current through the current source transistor is twice each of the input amplifier transistors, i.e., a 2:1 Gilbert cell mixer. However, the Gilbert cell mixer 500 according to an embodiment of the present invention includes current sources 580, 582 that free the circuit 500 from the 2:1 requirement.

The Gilbert cell mixer 500 according to an embodiment of the present invention includes four transistors 510, 511, 520, 521, known as an upper quad core of transistors 505. The upper quad core of transistors 505 are differentially connected in a common source configuration and in turn connected to a differentially connected at the lower, source coupled driver transistors 501, 502. As shown in FIG. 5, the Gilbert cell mixer 500 has two input ports RF+ 560, RF− 562, and output ports 570, 572.

A first pair of NMOS transistors 501, 502 has a common source terminal 504 that is connected to the drain of transistor 508. The source of transistor 508 is connected to the negative supply rail 507. The gate of transistor 508 controls the tail current through transistor 508. The drain of the first NMOS transistor 501 is connected to the common sources of a second NMOS pair 510, 511 and the drain of the second NMOS transistor 502 is connected to the common sources of a third NMOS pair 520, 521. The gates of the transistors 511 and 521 are connected together 526. The drain of transistor 510 is connected to the drain of transistor 521 at a node 522. The drains of the transistors 511 and 520 are connected together at a second node 523. The first node 522 is connected to a first output resistor 530, which is connected to the supply rail 540. The second node 523 is connected to a second output resistor 532, which is connected to the positive supply rail via 540.

The Gilbert cell mixer 500 of FIG. 5 also includes two additional current sources 580, 582 that allow the current through the upper quad transistors 510, 511, 520, 521 to be reduced and therefore operate at much lower supply voltages. The current sources 580, 582 provide additional current to the lower, source-coupled transistors 501, 502. The current sources 580, 582 thus provide lower voltage operation, lower LO drive and better linearity. The current sources are shown providing current to the circuit as well as including the arrows reversed to indicated that the current sources may be current sinks for sinking current away to alter the current requirements through the core switching devices 505 and RF input transconductor amplifier 503.

The Gilbert cell mixer of FIG. 5 allows less current to flow into the load, which reduces the IR drop in the load thereby allowing for lower supply voltages. Even if headroom isn't a problem, reducing the current through the switching transistors 510, 511, 520, 521 allows a reduction in the LO drive to give the same IR drop through the switching transistors 510, 511, 520, 521. By using less current through the LO switching transistors 510, 511, 520, 521 the IR drop across these transistors 510, 511, 520, 521 gets lower (for a given $V_{gs}$) but if headroom isn't an issue one can increase the resistance of the switching transistors 510, 511, 520, 521 back to the original value by reducing the gate to source voltage ($V_{gs}$). The gate to source voltage is directly related to LO drive. Hence by reducing the $V_{gs}$ on the switching transistors 510, 511, 520, 521, the LO drive may also be lowered.

An additional advantage of The Gilbert cell mixer of FIG. 5 if headroom isn't a major issue is that the biasing may be modified to provide better linearity. Better linearity leads to less distortion and therefore better third order intercept point (IP3) numbers. Increasing $V_{ds}$ of the RF transistors 501, 502 moves the signal swing to a more linear portion of the transistors IV curve. This produces lower non-linearity and hence better third order intercept point (IP3). The higher the intercept point, the better the device can amplify large signals without distortion. Although mixers are based on a fundamental non-linear principle, it is important that the mixer must also be able to amplify a range of incoming signals in a linear fashion.

For example, consider the scenario of having two input signals spaced relatively close together on the frequency spectrum fed into the mixer, one being the desired signal in the channel of interest and the other being the undesired signal (an interfering signal of the adjacent channel). The collaborated effects of these signals are known as inter-modulation. Most critical are third-order inter-modulation (IM3) components that appear at the output of the mixer. Their frequencies of $2\omega_{RF+}-\omega_{RF-}$ and $2\omega_{RF-}-\omega_{RF+}$ may lie within the passband of the desired IF, subsequent to the mixing operation. As the RF input power increases, the output power of the undesired IM3 signals will intersect the output power of the desired signal. It is this intersection that is referred to as the IP3 point.

Figure 6:
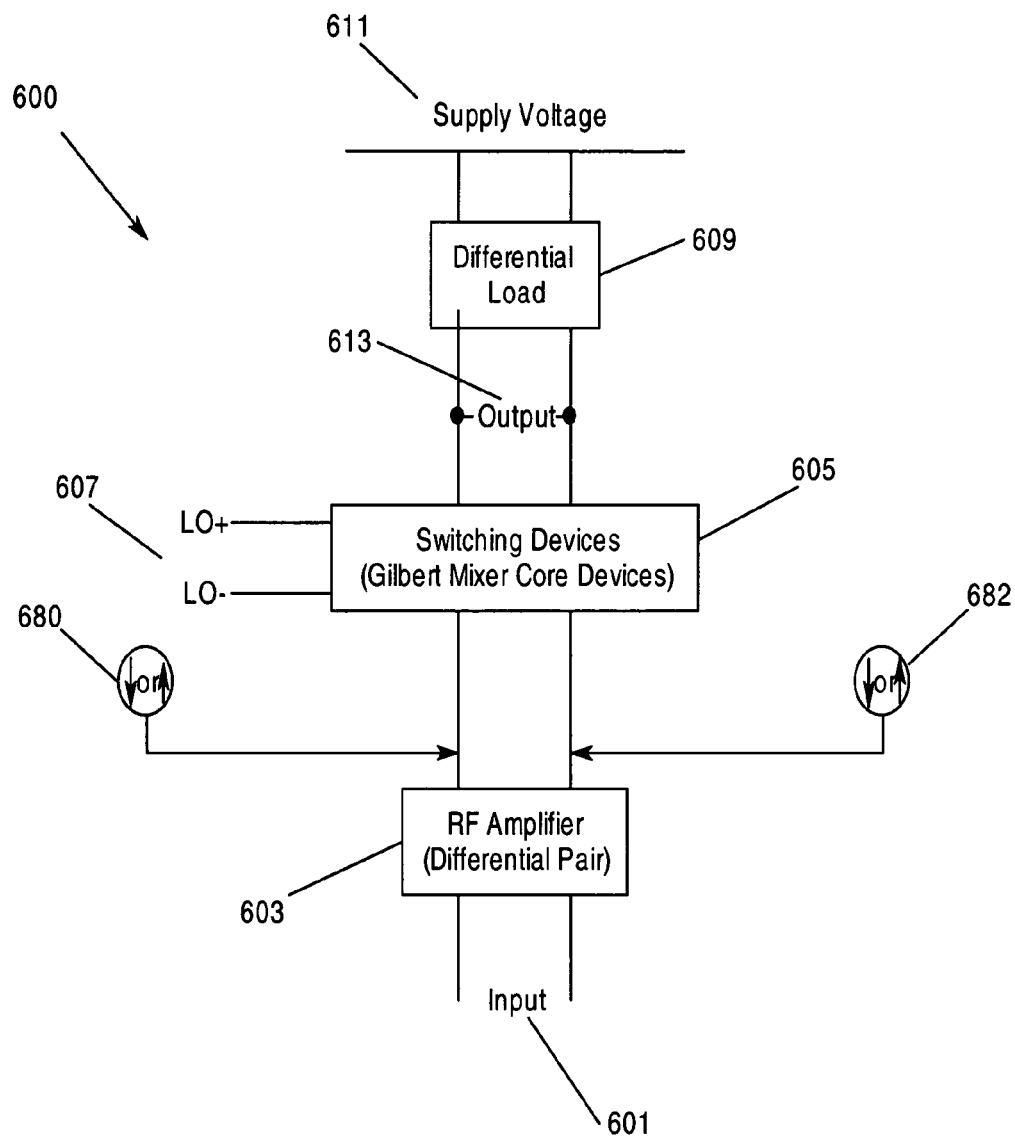
FIG. 6 is a block diagram of a Gilbert cell mixer according to an embodiment of the present invention.

FIG. 6 is a block diagram of a Gilbert cell mixer according to an embodiment of the present invention. The Gilbert cell mixer includes an RF input transconductor amplifier 603, core switching devices 605 and differential load 609. The Gilbert cell mixer 600 of FIG. 6 also includes two additional current sources 680, 682 that allow the current through the core switching devices 605 to be reduced and therefore operate at much lower supply voltages. The current sources 680, 682 provide additional current to the RF input transconductor amplifier 603. The current sources 680, 682 thus provide lower voltage operation, lower LO drive and better linearity.

FIGS. 5–6 show a current source being provided for altering the current requirements through the core switching devices 505, 605 and RF input transconductor amplifier 503, 603. However, the current modifier could be a current sink for sinking current away to alter the current requirements through the core switching devices 505, 605 and RF input transconductor amplifier 503, 603. Moreover, while the invention has been described in the drawings referenced above using FET transistors, the present invention is not meant to be limited to a particular transistor device. Rather, the principles for providing a non 2:1 Gilbert cell mixer according to the embodiments of the present invention are applicable to different semiconductor technologies.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A mixer, comprising:
  a differential amplifier for receiving and amplifying input signals, the differential amplifier providing a predetermined gain to the input signals;
  a load for providing a load impedance;
  a dual differential switching stage, coupled to the differential amplifier and the load, the dual differential switching stage mixing the amplified input signals from the differential amplifier with a local oscillator signal to produce an output signal at the load; and a current sink, coupled to the differential amplifier, the current sink drawing current from the differential amplifier to adjust current through the load.

2. The mixer of claim 1, wherein the current sink comprises a first and second current device, the first current device being coupled to a first transistor of the differential amplifier and the second current device being coupled to a second transistor of the differential amplifier.

3. The mixer of claim 2, wherein the current sink increases the current flowing through the load.

4. The mixer of claim 1, wherein the differential amplifier comprises a first and second transistor differentially coupled having first electrodes joined at a common node.

5. The mixer of claim 4, wherein the first electrodes comprise sources of the first and second transistors of the differential amplifier.

6. The mixer of claim 4, wherein the first electrodes comprise drains of the first and second transistors of the differential amplifier.

7. The mixer of claim 4, wherein the dual differential switching stage comprises a first differential transistor pair having first electrodes coupled at a first common connection and a second differential transistor pair having second electrodes coupled at a second common connection, the first common connection being coupled to a second electrode of the first transistor of the differential amplifier and the second common connection being coupled to a second electrode of the second transistor of the differential amplifier.

8. The mixer of claim 7, wherein the first electrodes of the first differential transistor pair comprise sources, the second electrodes of the second differential transistor pair comprise sources, the second electrode of the first transistor of the differential amplifier comprises a drain and the second electrode of the second transistor of the differential amplifier comprises a drain.

9. The mixer of claim 7, wherein the first electrodes of the first differential transistor pair comprise source electrodes, the second electrodes of the second differential transistor pair comprise source electrodes, the second electrode of the first transistor of the differential amplifier comprises a drain electrode and the second electrode of the second transistor of the differential amplifier comprises a drain electrode.

10. The mixer of claim 1, wherein the dual differential switching stage comprises a first differential transistor pair having first electrodes coupled at a first common connection and a second differential transistor pair having second electrodes coupled at a second common connection.

11. The mixer of claim 10, wherein the first electrodes and second electrodes comprise source electrodes.

12. The mixer of claim 10, wherein the first electrodes and second electrodes comprise drain electrodes.

13. The mixer of claim 1, wherein the dual differential switching stage comprises first and second differential pairs, the first and second differential pairs having output electrodes cross coupled.

14. A mixer, comprising:
a Gilbert cell comprising an RF amplifier stage and a mixer stage; and
a current sink, coupled to the RF amplifier stage, the current sink drawing current from the RF amplifier stage to adjust current through a load.

15. The mixer of claim 14, wherein the current sink comprises a first and second current device, the first current device being coupled to a first transistor of the amplifier stage and the second current device being coupled to a second transistor of the amplifier stage.

16. The mixer of claim 15, wherein the current sink increases the current flowing through the load.

17. The mixer of claim 14, wherein the mixer stage comprises first and second differential pairs, the first and second differential pairs having output electrodes cross coupled.

18. A method for mixing two signals, comprising:
providing a Gilbert cell comprising an RF amplifier stage and a mixer stage; and
sinking current from the amplifier stage to alter current through the mixer stage.

19. A mixer, comprising:
means for amplifying an input signal;
means for receiving the amplified input signal and for providing a balanced differential output signal having a first frequency translated using the frequency of the amplified input signal; and
means, coupled to the means for amplifying, for sinking current from the means for amplifying to alter current through the means for receiving the amplified input signal and for providing a balanced differential output signal.

20. A mixer, comprising:
a differential amplifier for receiving and amplifying a first input signal;
first and second current sinks, each coupled to the differential amplifier, the first and second current sinks altering the amplification of the first input signal;
a load for providing a load impedance; and
a dual differential switching stage, coupled to the differential amplifier and to the load, the dual differential switching stage mixing a second input signal with the altered and amplified first input signal, whereby an output signal is produced at the load.

* * * * *